(12) United States Patent
Kim et al.

(10) Patent No.: US 7,463,100 B2
(45) Date of Patent: Dec. 9, 2008

(54) PHASE FREQUENCY DETECTOR CAPABLE OF IMPROVING NOISE CHARACTERISTICS

(75) Inventors: Yoo Hwan Kim, Kyungki-Do (KR); Ki Sung Kwon, Seoul (KR); Soo Woong Lee, Kyungki-Do (KR); Jin Taek Lee, Kyungki-Do (KR); Yo Sub Moon, Kyungki-Do (KR); Sung Cheol Shin, Seoul (KR); Gyu Suck Kim, Seoul (KR)

(73) Assignee: Samsung Electro-Mechanics Co., Ltd., Suwon, Kyungki-Do (KR)

( * ) Notice: Subject to any disclaimer, the term of this patent is extended or adjusted under 35 U.S.C. 154(b) by 97 days.

(21) Appl. No.: 11/549,046

(22) Filed: Oct. 12, 2006

(65) Prior Publication Data

US 2007/0120611 A1  May 31, 2007

(30) Foreign Application Priority Data

Nov. 25, 2005  (KR) ............... 10-2005-0113552

(51) Int. Cl.
   *H03L 7/00* (2006.01)
(52) U.S. Cl. .................. 331/25; 331/11; 327/3
(58) Field of Classification Search .......... 331/11, 331/25; 327/3, 12
   See application file for complete search history.

(56) References Cited

U.S. PATENT DOCUMENTS

| | | | | |
|---|---|---|---|---|
| 6,075,416 A | * | 6/2000 | Dalmia | 331/25 |
| 6,566,967 B1 | * | 5/2003 | Anumula et al. | 331/11 |
| 6,987,406 B1 | * | 1/2006 | Chiu | 327/156 |
| 7,009,456 B2 | * | 3/2006 | Jasa et al. | 331/16 |

FOREIGN PATENT DOCUMENTS

JP   2001-144607 A   5/2001

OTHER PUBLICATIONS

Korean Intellectual Property Office, Office Action mailed Oct. 30, 2006.

* cited by examiner

*Primary Examiner*—Joseph Chang
(74) *Attorney, Agent, or Firm*—Lowe Hauptman Ham & Berner (57) ABSTRACT

A phase frequency detector for improving in-band phase noise characteristics of a PLL is disclosed. The phase frequency detector compares a reference frequency with a division frequency created by dividing an output frequency of a voltage controlled oscillator (VCO) by a predetermined division ratio, creates a phase-difference signal corresponding to a phase difference between the reference frequency and the division frequency, and improves noise characteristics.

7 Claims, 9 Drawing Sheets

Prior art

PHASE FREQUENCY DETECTOR CAPABLE OF IMPROVING NOISE CHARACTERISTICS

RELATED APPLICATION

The present application is based on, and claims priority from, Korean Application Number 2005-113552, filed Nov. 25, 2005, the disclosure of which is incorporated by reference herein in its entirety.

BACKGROUND OF THE INVENTION

1. Field of the Invention

The present invention relates to a phase frequency detector capable of improving in-band phase noise characteristics of a Phase Lock Loop or Phase Locked Loop (PLL), and more particularly to a phase frequency detector for acquiring linear output characteristics from all phase comparison ranges of a reference frequency and a division frequency, such that it can improve in-band characteristics of the PLL.

2. Description of the Related Art

Typically, a PLL is a requisite circuit required for a communication system to perform a variety of functions (e.g., frequency synthesis, and a clock or data recovery). Recently, the higher the operation speed of the communication system, the lighter the weight of the communication system. In order to implement the aforementioned characteristics, many developers are conducting intensive research into technology for low-voltage and low-power characteristics and the PLL capable of being stably operated at a high-frequency band.

Figure 1:
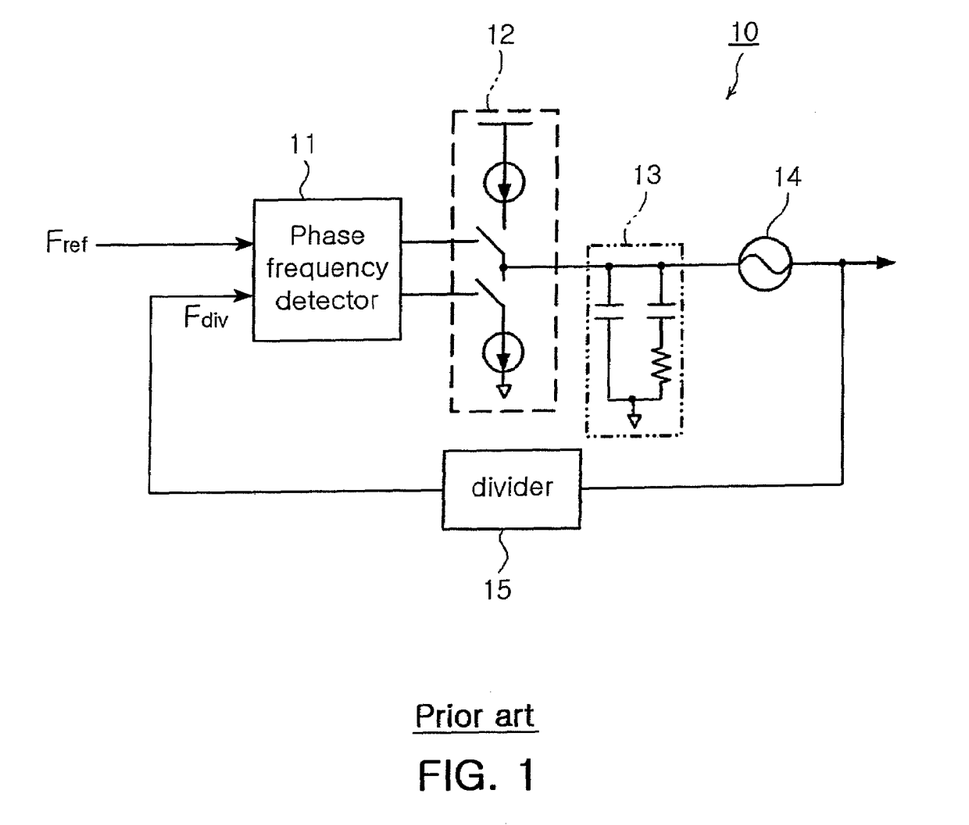
FIG. 1 is a circuit diagram illustrating a conventional PLL.

FIG. 1 is a circuit diagram of a conventional PLL. A conventional PLL 10 will hereinafter be described with reference to FIG. 1.

Referring to FIG. 1, the PLL 10 divides a frequency created by a crystal (x-tal) oscillator (not shown) according to a channel step required for a reference divider (not shown), and generates a reference frequency (Fref). A phase frequency detector (PFD) 11 compares an output frequency of a Voltage Controlled Oscillator (VCO) 14 with a division frequency (Fdiv) created by the frequency divider 15 for dividing the output frequency of the VCO 14 at a predetermined ratio, such that it creates an Up or Down signal corresponding to a phase difference between the output frequency of the VCO 14 and the division frequency Fdiv.

A charge pump 12 receives the Up or Down signal from the PFD 11, creates a sourcing current by the Up signal, creates a sinking current by the Down signal, and provides a loop filter 13 with the sourcing or sinking current. In this case, an amount of current signals applied to the loop filter 13 may be adjusted by an additional signal received from an external part. The current signal applied to the loop filter 13 creates a voltage signal capable for generating an output frequency desired by the VCO 14, such that it controls the output frequency of the VCO 14. In other words, the VCO 14 creates an output frequency controlled by the output voltage of the loop filter.

The above-mentioned noise characteristics of the PLL 10 are classified into first noise characteristics generated by the PFD 11 and second noise characteristics created by the VCO 14. If a transfer function is calculated under the above-mentioned situation of the first or second noise characteristics, the following characteristics may occur. In more detail, transfer characteristics of noise created by the PFD 11 are inversely proportional to a gain of the PFD 11, and are proportional to a division ratio of the frequency divider 15. In the meantime, transfer characteristics of noise created by the VCO 14 are also associated with characteristics of the loop filter 13.

Namely, the noise created by the PFD 11 is equal to in-band phase noise of the PLL 10, and the noise created by the VCO 14 is equal to out-band phase noise of the PLL 10.

As described above, a factor for determining the in-band phase noise within a bandwidth designed for optimum characteristics of the PLL is indicative of the noise created by the PFD. The above-mentioned noise created by the PLL indicates the gain and linearity of the PFD.

Therefore, there must be newly developed an improved technology capable of solving nonlinearity of the PFD to improve in-band phase noise characteristics of the PLL.

SUMMARY OF THE INVENTION

Therefore, the present invention has been made in view of the above problems, and it is an object of the present invention to provide a phase frequency detector (PFD) for selectively outputting a specific area capable of guaranteeing linearity of each of two PFDs, guaranteeing linearity in a total phase comparison range, thereby improving in-band phase noise characteristics, In accordance with one aspect of the present invention, the above and other objects can be accomplished by the provision of a phase frequency detector for comparing a reference frequency with a division frequency created by dividing an output frequency of a voltage controlled oscillator (VCO) by a predetermined division ratio, creating a phase-difference signal corresponding to a phase difference between the reference frequency and the division frequency, and improving noise characteristics, the phase frequency detector comprising: a first phase frequency detector for receiving the reference frequency and the division frequency, creating a first phase-difference signal corresponding to a phase difference between the received reference and division frequencies, and having nonlinearity if the phase difference between the reference and division frequencies is in a first range; a second phase frequency detector for receiving the reference frequency and the division frequency, creating a second phase-difference signal corresponding to a phase difference between the received reference and division frequencies, and having nonlinearity if the phase difference between the reference and division frequencies is in a second range different from the first range; and a signal selection unit for generating the second phase-difference signal if the phase difference between the reference and division frequencies is in the first range, and generating the first phase-difference signal if the phase difference between the reference and division frequencies is in the second range.

Preferably, the first range is a specific range $[-\pi, \pi]$.

Preferably, the second range is a range $[-2\pi, -\pi]$ and another range $[\pi, 2\pi]$.

Preferably, the first phase frequency detector includes: a first D-flipflop for triggering a power-supply voltage by replying to a rising edge of the reference frequency, and outputting the triggered result; a second D-flipflop for triggering the power-supply voltage by replying to a rising edge of the division frequency (Fdiv), and outputting the triggered result; and a first NAND logic unit for performing a NAND logic operation of the output signals of the first D-flipflop and the second D-flipflop, and outputting the NAND-logic result to reset terminals of the first and second D-flip-flops.

Preferably, the second phase frequency detector includes: a third D-flipflop for triggerring an inversion signal of its output signal by replying to a rising edge of the reference frequency, and outputting the triggered result; an inverter for inverting the division frequency; a fourth D-flipflop for triggerring an inversion signal of its output signal by replying to a rising edge of the inversion frequency of the division frequency generated from the inverter, and outputting the triggered result; an XOR logic unit for performing a logic operation on the output signals of the third and fourth D-flipflops; a fifth D-flipflop for triggerring an output signal of the XOR logic unit by replying to the rising edge of the reference frequency, outputting an inversion signal of the output signal of the XOR logic unit, and receiving an output signal of a sixth D-flipflop at its reset terminal; a sixth D-flipflop for triggerring an output signal of the XOR logic unit by replying to the rising edge of the division frequency, outputting the triggered result, and receiving the inversion signal generated from the fifth D-flipflop at its reset terminal; a second NAND logic unit for performing a NAND logic operation of the output signals of the XOR logic unit and the sixth D-flipflop, and outputting the NAND-logic result; a third NAND logic unit for performing a NAND logic operation of the output signal of the second NAND logic unit and the inversion signal generated from the fifth D-flipflop, and outputting the NAND-logic result.

Preferably, the signal selection unit includes: a window detector for determining any one of the first range and the second range to be a window, and determining whether the phase difference between the reference frequency and the division frequency is contained in the window; and a signal selector for selecting a phase-difference signal having nonlinearity within a range different from that of the window if the phase difference between the reference frequency and the division frequency is contained in the window, selecting a phase-difference signal having nonlinearity within the window if the phase difference between the reference frequency and the division frequency is not contained in the window, and outputting the selected phase-difference signal.

Preferably, the first range is a range $[-\pi, \pi]$, and the second range is a range $[-2\pi, -\pi]$ and a range $[\pi, 2\pi]$.

Preferably, the window detector determines the first range to be the window, and determines whether the phase difference between the reference frequency and the division frequency is contained in the first range.

Preferably, the signal selector selects the second phase-difference signal if the phase difference between the reference frequency and the division frequency is contained in the first range, selecting the first phase-difference signal if the phase difference between the reference frequency and the division frequency is not contained in the first range, and outputting the selected phase-difference signal.

Preferably, the window detector comprises: a first window setup unit, a second window setup unit, a NAND logic unit.

Preferably, the first window setup unit includes: a first inversion buffer for inverting the reference frequency; a first delay cell for delaying the inverted reference frequency by a predetermined phase difference corresponding to the half of the first range; a first AND logic unit for performing an AND logic operation of the inverted delayed reference frequency and the reference frequency, and outputting the AND-logic result; a second delay cell for delaying the division frequency by a specific phase equal to the phase-difference delay of the first delay cell; and a seventh D-flipflop for triggering the output signal of the first AND logic unit by replying to the rising edge of the output signal of the second delay cell, and outputting an inversion signal of the output signal of the first AND logic unit.

Preferably, the second window setup unit includes: a second inversion buffer for inverting the division frequency; a third delay cell for delaying the inverted division frequency by a specific phase equal to the phase-difference delay of the first delay cell; a second AND logic unit for performing an AND logic operation of the inverted delayed division frequency and the division frequency, and outputting the AND-logic result; a fourth delay cell for delaying the reference frequency by a specific phase equal to the phase-difference delay of the first delay cell; and an eighth D-flipflop for triggering the output signal of the second AND logic unit by replying to the rising edge of the output signal of the fourth delay cell, and outputting an inversion signal of the output signal of the second AND logic unit.

Preferably, the NAND logic unit performs a NAND operation of the output signal of the first window setup unit and the output signal of the second window setup unit.

Preferably, the signal selector outputs the second phase-difference signal if the window detector outputs a logic high signal, and outputs the first phase-difference signal if the window detector outputs a logic low signal.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Now, preferred embodiments of the present invention will be described in detail with reference to the annexed drawings. In the drawings, the same or similar elements are denoted by the same reference numerals even though they are depicted in different drawings. In the following description, a detailed description of known functions and configurations incorporated herein will be omitted when it may make the subject matter of the present invention rather unclear.

Figure 2:
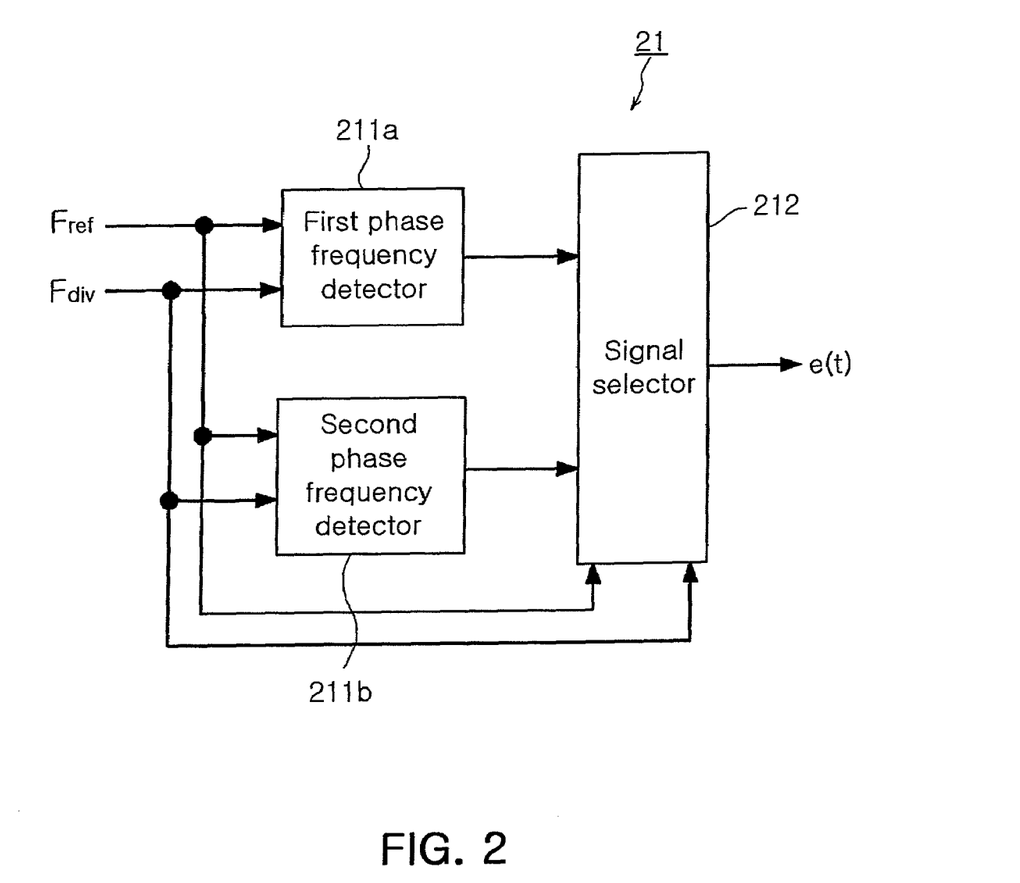
FIG. 2 is a block diagram illustrating a phase frequency detector (PFD) in accordance with a preferred embodiment of the present invention.

FIG. 2 is a block diagram illustrating a phase frequency detector (PFD) in accordance with a preferred embodiment of the present invention.

Referring to FIG. 2, the PFD 21 according to the present invention includes a first PFD 211a, a second PFD 211b, and a signal selection unit 212. The first PFD 211a receives a predetermined reference frequency (Fref) of a PLL, receives a division frequency (Fdiv) created by dividing an output frequency of a VCO by a predetermined division ratio, and generates a first phase-difference signal corresponding to a phase difference between the reference frequency (Fref) and the division frequency (Fdiv). The second phase PFD 211b receives the reference frequency (Fref) and the division frequency, and generates a second phase-difference signal corresponding to a phase difference between the reference frequency (Fref) and the division frequency (Fdiv). The signal selection unit 212 selects any one of the first phase-difference signal and the second phase-difference signal according to the determined phase difference between the reference frequency (Fref) and the division frequency (Fdiv).

The first PFD 211a receives the reference frequency (Fref) and the division frequency (Fdiv), and generates a first phase-difference signal corresponding to a phase difference between the reference frequency (Fref) and the division frequency (Fdiv). The first PFD 211a has nonlinear characteristics within a first range according to the change of the phase difference between the reference frequency (Fref) and the division frequency (Fdiv). In more detail, if the phase difference between the reference frequency (Fref) and the division frequency (Fdiv) is in the first range, nonlinear characteristics between the above-mentioned phase difference and the first phase-difference signal are established.

Figure 3:
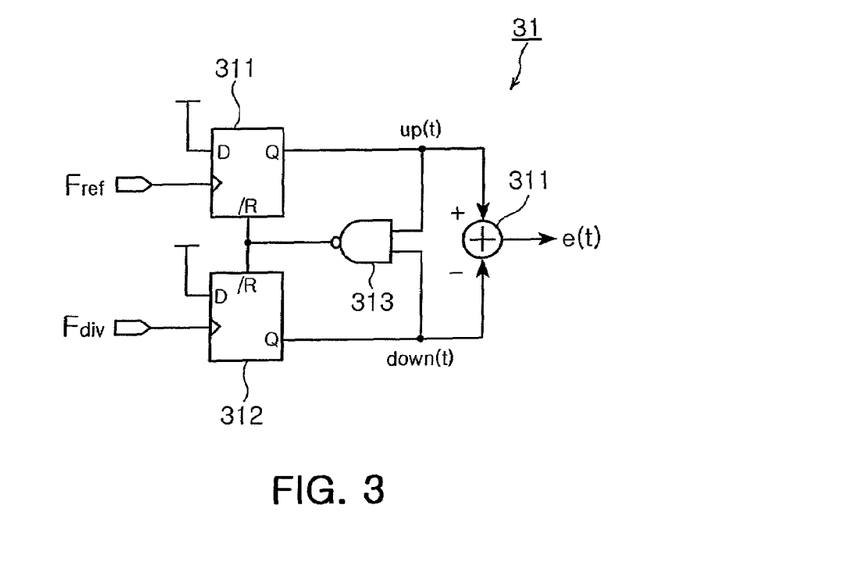
FIG. 3 is a circuit diagram illustrating a first phase frequency detector (PFD) in accordance with a preferred embodiment of the present invention.

FIG. 3 is a circuit diagram illustrating a first phase frequency detector (PFD) in accordance with a preferred embodiment of the present invention.

Referring to FIG. 3, the first PFD 31 includes a first D-flipflop 311, a second D-flipflop 312, and a first NAND logic unit 313. The first D-flipflop 311 triggers a power-supply voltage by replying to a rising edge of the reference frequency (Fref), and outputs the triggered result. The second D-flip-flop 312 triggers a power-supply voltage by replying to a rising edge of the division frequency (Fdiv), and outputs the triggered result. The first NAND logic unit 313 performs a NAND logic operation of the output signals of the first D-flip-flop 311 and the second D-flipflop 312, and outputs the NAND-logic result to individual reset terminals of the first and second D-flipflops 311 and 312. Typically, it should be noted that the above-mentioned PFD 31 is called a tristate phase frequency detector (i.e., tristate PFD).

Figure 5:
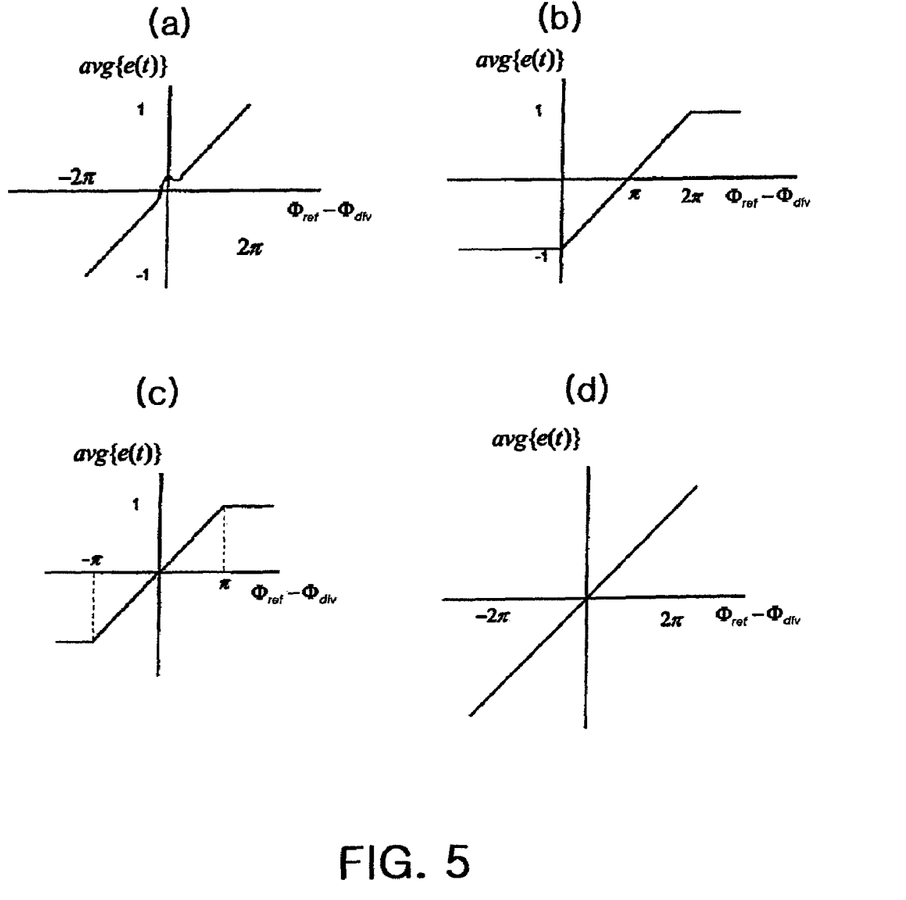
FIG. 5a is a graph illustrating an output signal depending on a phase difference of the first PFD shown in FIG. 3 according to the present invention.
FIG. 5b is a graph illustrating an output signal depending on a phase difference of a general XOR-based phase frequency detector (PFD) according to the present invention.
FIG. 5c is a graph illustrating an output signal depending on a phase difference of the second PFD shown in FIG. 4 according to the present invention.
FIG. 5d is a graph illustrating an output signal of a signal selection unit according to the present invention.

The first PFD 31 of FIG. 3 has output characteristics equal to those of FIG. 5a. FIG. 5a is a graph illustrating an output signal depending on a phase difference of the first PFD shown in FIG. 3. The output signals of the first and second D-flipflops 311 and 312 of the first PFD 31 are summed up, and an average value of the output signals is acquired. If the acquired average value is represented by a phase difference between the reference frequency (Fref) and the division frequency (Fdiv), the above-mentioned phase difference has nonlinear characteristics in the vicinity of a specific location at which the phase difference is 0°.

Therefore, the first PFD 31 of FIG. 3 may determine a specific range from a first location $[-2\pi, 2\pi]$ to a second location $[-\pi, \pi]$ to be a first range having the nonlinearity. In other words, the first range of the tristate PFD is indicative of the range $[-\pi, \pi]$ in which there is little phase difference between the reference frequency (Fref) and the division frequency (Fdiv), such that the nonlinear characteristics occur in the first range $[-\pi, \pi]$. As previously stated in the conventional art, in-band phase noise increases due to the above-mentioned nonlinear characteristics.

Referring back to FIG. 2, the second PFD 211b receives the reference frequency (Fref) and the division frequency (Fdiv), and generates a second phase-difference signal corresponding to the phase difference between the reference frequency (Fref) and the division frequency (Fdiv). The second PFD 211b has nonlinearity within a second range according to the change of the phase difference between the reference frequency (Fref) and the division frequency (Fdiv). In other words, if the phase difference between the reference frequency (Fref) and the division frequency (Fdiv) is in the second range, the second PFD 211b has nonlinear characteristics between the phase difference and the second phase-difference signal. It should be noted that the above-mentioned second range is different from the first range. Namely, the nonlinearity range of the second phase-difference signal generated from the second PFD 211b is different from that of the first phase-difference signal generated from the first PFD 211a.

Figure 4:
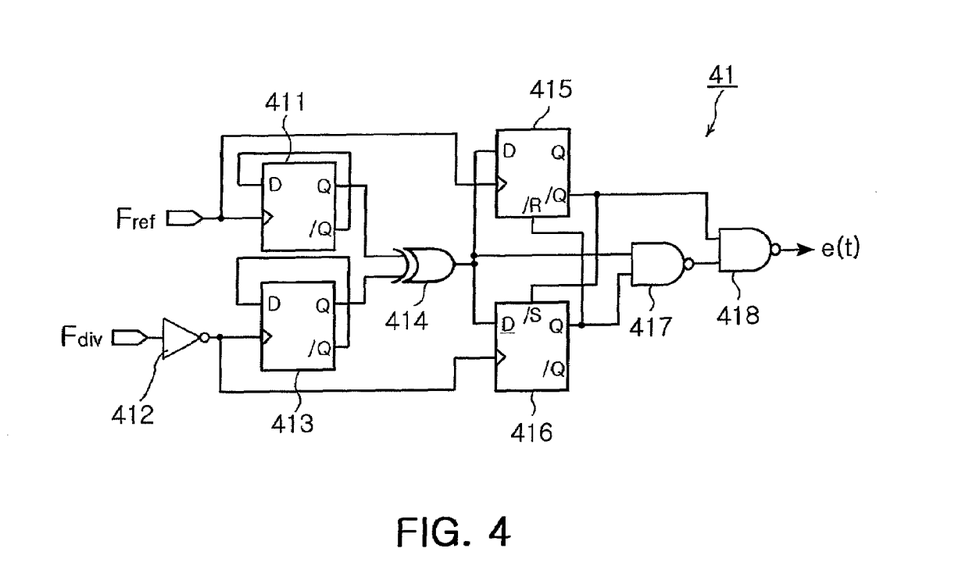
FIG. 4 is a circuit diagram illustrating a second PFD in accordance with a preferred embodiment of the present invention.

FIG. 4 is a circuit diagram illustrating a second PFD in accordance with a preferred embodiment of the present invention.

Referring to FIG. 4, the second PFD 41 includes a third D-flipflop 411, an inverter 412, a fourth D-flipflop 413, an XOR logic unit 414, a fifth D-flipflop 415, a sixth D-flip-flop 416, a second NAND logic unit 417, and a third NAND logic unit 418.

The third D-flipflop 411 triggers an inversion signal of its own output signal by replying to a rising edge of the reference frequency (Fref), and outputs the triggered result. The inverter 412 inverts the division frequency (Fdiv). The fourth D-flipflop 413 triggers an inversion signal of its own output signal by replying to a rising edge of the inversion frequency of the division frequency (Fdiv) generated from the inverter 412, and outputs the triggered result. The XOR logic unit 414 performs logic operation on the output signals of the third and fourth D-flipflops 411 and 413. The fifth D-flip-flop 415 triggers an output signal of the XOR logic unit 414 by replying to the rising edge of the reference frequency (Fref), outputs an inversion signal of the output signal of the XOR logic unit 414, and receives an output signal of the sixth D-flipflop 416 at a reset terminal. The sixth D-flipflop 416 triggers an output signal of the XOR logic unit 414 by replying to the rising edge of the division frequency (Fdiv), outputs the triggered result, and receives the inversion signal generated from the fifth D-flipflop 415 at a reset terminal. The second NAND logic unit 417 performs a NAND logic operation of the output signals of the XOR logic unit 414 and the sixth D-flipflop 416, and outputs the NAND-logic result. The third NAND logic unit 418 performs a NAND logic operation of the output signal of the second NAND logic unit 417 and the inversion signal generated from the fifth D-flipflop 415, and outputs the NAND-logic result.

Typically, if the above-mentioned inverter 312 is excluded from the PFD shown in FIG. 4, an XOR logic unit is applied to the above-mentioned PFD, such that the above-mentioned PFD is called an XOR-based PFD.

The XOR-based PFD created by subtracting the inverter 312 from the second PFD 41 of FIG. 4 has the output characteristics shown in FIG. 5b. FIG. 5b is a graph illustrating an output signal depending on a phase difference of a general XOR-based phase frequency detector (PFD) according to the present invention.

Referring to FIG. 5b, if an average value of the output signals of the XOR-based PFD other than the inverter is represented by a phase difference between the reference frequency (Fref) and the division frequency (Fdiv), the average value has linear characteristics within a specific range [−0, 2π], and has nonlinear characteristics within another range [−2π, 0].

The second PFD 41 according to the present invention further includes the inverter 412 for inverting the division frequency (Fdiv). Therefore, the inverter 412 changes a phase of the division frequency (Fdiv) by a predetermined value π. The second PFD 41 equipped with the inverter 412 has the output characteristics shown in FIG. 5c. FIG. 5c is a graph illustrating an output signal depending on a phase difference of the second PFD shown in FIG. 4 according to the present invention. Namely, the second PFD 41 has the linear characteristics within a specific range [−π, π], and has nonlinear characteristics within ranges [−2π, −π] and [π, 2π]. The second range of the second PFD 31 is a range [−2π, −π] and another range [π, 2π].

Referring back to FIG. 2, the signal selection unit 212 outputs any one of the output signal of the first PFD 211a and the output signal of the second PFD 211b according to a phase-difference range of the reference frequency (Fref) and the division frequency (Fdiv), determines the selected signal to be an output signal of the inventive PFD, and outputs the determined signal as the output signal of the inventive PFD.

In this case, if the phase difference between the reference frequency (Fref) and the division frequency (Fdiv) is contained in the first range [−π, π], the signal selection unit 212 determines the output signal of the second PFD 211b to be an output signal of the inventive PFD 21, and outputs the determined signal as the output signal of the inventive PFD 21.

Otherwise, if the phase difference between the reference frequency (Fref) and the division frequency (Fdiv) is not contained in the first range [−π, z], namely, if the above-mentioned phase difference is contained in the second range ([−2π, −π] and [π, 2π]), the signal selection unit 212 determines the output signal of the first PFD 211a to be an output signal of the inventive PFD 21, and outputs the determined signal as the output signal of the inventive PFD 21.

In this way, the above-mentioned signal selection unit 212 selects linear output signals of the first and second PFDs 211a and 211b according to the phase difference between the reference frequency (Fref) and the division frequency (Fdiv), and outputs the selected linear output signals. Therefore, as shown in FIG. 5d, the PFD 21 according to the present invention can acquire linear output signals in an overall phase comparison range [−2π, 2π]. FIG. 5d is a graph illustrating an output signal of the signal selection unit 212 according to the present invention.

Figure 6:
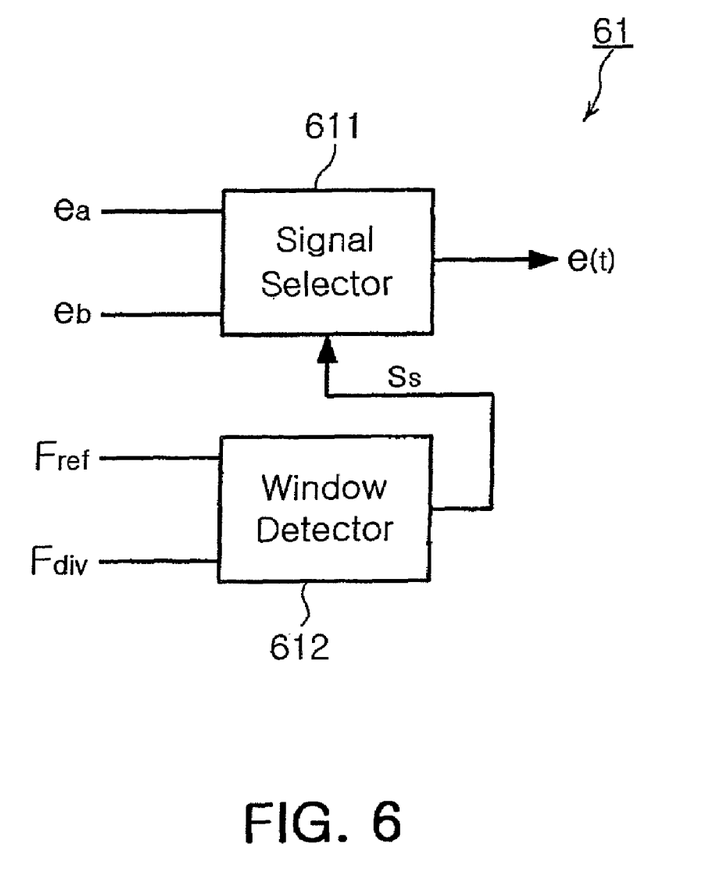
FIG. 6 is a detailed block diagram illustrating a signal selection unit according to the present invention.

FIG. 6 is a detailed block diagram illustrating an example of the signal selection unit according to the present invention. Referring to FIG. 6, the signal selection unit 61 includes a window detector 612 and a signal selector 611.

The window detector 612 determines any one of the first and second ranges to be a window, and determines whether a phase difference between the reference frequency and the division frequency is contained in the window.

If it is determined that the phase difference between the reference frequency and the division frequency is contained in the window, the signal selector 611 selects a phase-difference signal having nonlinearity within a range different from that of the window, and outputs the selected phase-difference signal. If it is determined that the phase difference between the reference frequency and the division frequency is not contained in the window, the signal selector 611 selects a phase-difference signal having nonlinearity within the above-mentioned window range, and outputs the selected phase-difference signal.

Provided that the first range is the range [−π, π], and the second range corresponds to the range [−2π, −π] and the range [π, 2π], the window detector 612 determines the first range to be a window, and determines whether the phase difference between the reference frequency and the division frequency is contained in the first range, and may transmit the determined signal (Ss) to the signal selector 611 as necessary.

If it is determined that the phase difference between the reference frequency and the division frequency is contained in the first range, the signal selector 611 selects the second phase-difference signal, and outputs the selected second phase-difference signal to an output terminal of the PFD 21. If it is determined that the phase difference between the reference frequency and the division frequency is not contained in the first range, the signal selector 611 selects the first phase-difference signal, and outputs the selected first phase-difference signal to an output terminal of the PFD 21.

Figure 7:
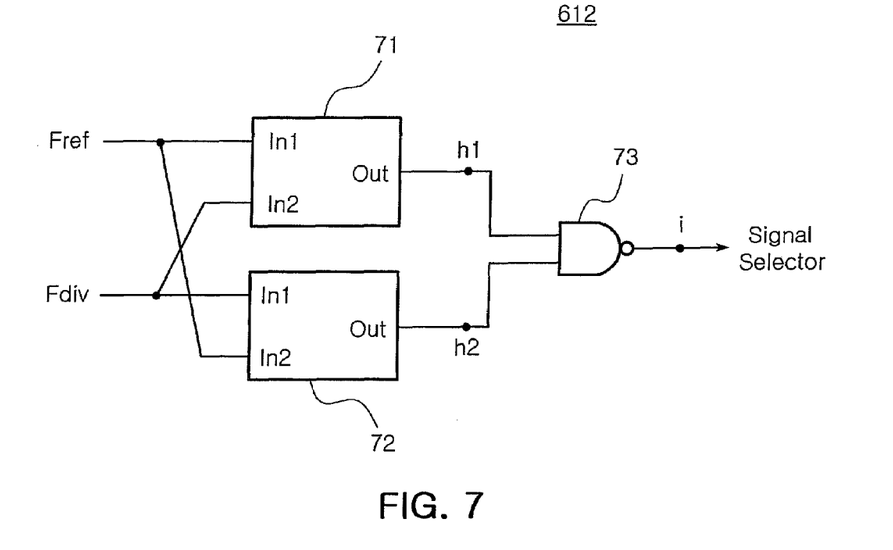
FIG. 7 is a detailed block diagram illustrating a window detector contained in the signal selection unit shown in FIG. 6 according to the present invention.

FIG. 7 is a detailed block diagram illustrating a window detector contained in the signal selection unit shown in FIG. 6 according to the present invention.

Referring to FIG. 7, the window detector 612 contained in the signal selection unit according to the present invention includes a first window setup unit 71, a second window setup unit 72, and a NAND logic unit 73.

Figure 8:
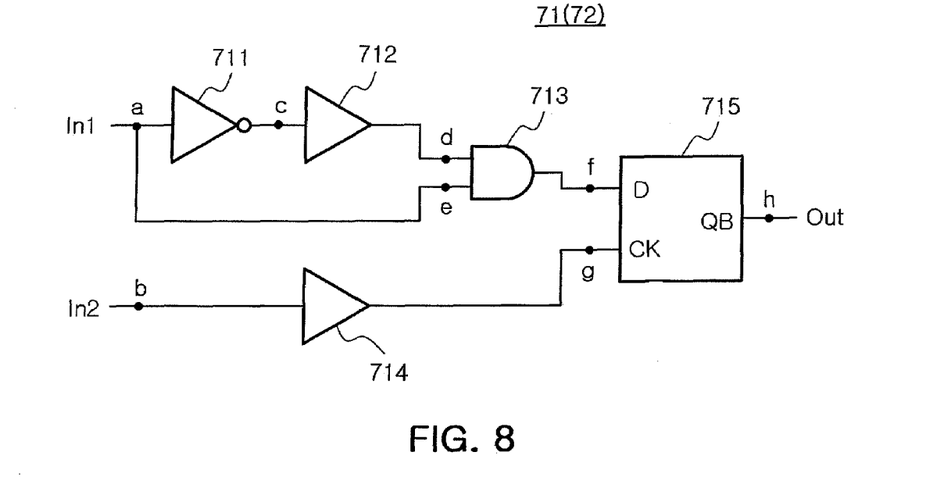
FIG. 8 is a detailed block diagram illustrating a window setup unit contained in the window detector shown in FIG. 7 according to the present invention.

The first window setup unit 71 and the second window setup unit 72 may be equal to those of FIG. 8, however, it should be noted that signals applied to two input terminals In1 and In2 shown in FIG. 7 are different from those of FIG. 8.

FIG. 8 is a detailed block diagram illustrating a window setup unit contained in the window detector shown in FIG. 7 according to the present invention.

Referring to FIG. 8, the window setup unit 71 includes a first inversion buffer 711, a first delay cell 712, an AND logic unit 713, a second delay cell 714, and a D-flipflop 715. The first inversion buffer 711 inverts a frequency signal applied to the first input terminal In1. The first delay cell 712 delays the inverted frequency signal by a predetermined phase difference. The AND logic unit 713 performs AND logic operation of the inverted delay frequency signal and the frequency signal applied to the first input terminal In1, and outputs the AND-logic result. The second delay cell 714 delays the frequency signal applied to the second input terminal In2 by a specific phase equal to the phase-difference delay of the first delay cell 712. The D-flipflop 715 triggers the output signal of the AND logic unit 713 by replying to the rising edge of the output signal of the second delay cell 714, and outputs an inversion signal of the output signal of the AND logic unit 713.

The first and second window setup units are equal to those of FIG. 8. The reference frequency (Fref) is applied to the first input terminal (In1) of the first window setup unit 71, and the division frequency (Fdiv) is applied to the second input terminal (In2) of the first window setup unit 71. The division frequency (Fdiv) is applied to the first input terminal (In1) of the second window setup unit, and the reference frequency (Fref) is applied to the second input terminal (In2) of the second window setup unit.

The first and second window setup units determine their windows according to the degree of delay created by the first delay cell 712. The degree of delay created by the first delay cell may be determined to be the half of a specific period in which the reference and division frequencies have the nonlinearity.

Figure 9A:
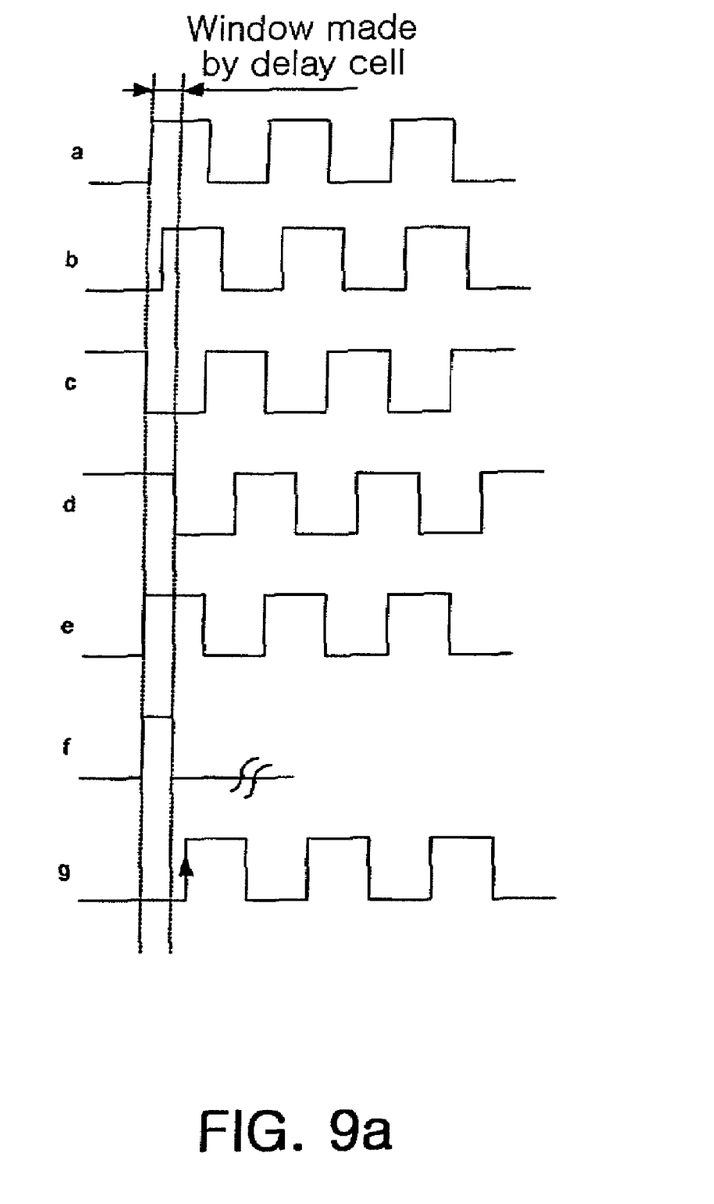
FIGS. 9a~9c are waveform diagrams illustrating waveforms displayed at individual nodes contained in the block diagrams of FIGS. 7~8 according to the present invention.
Figure 9B:
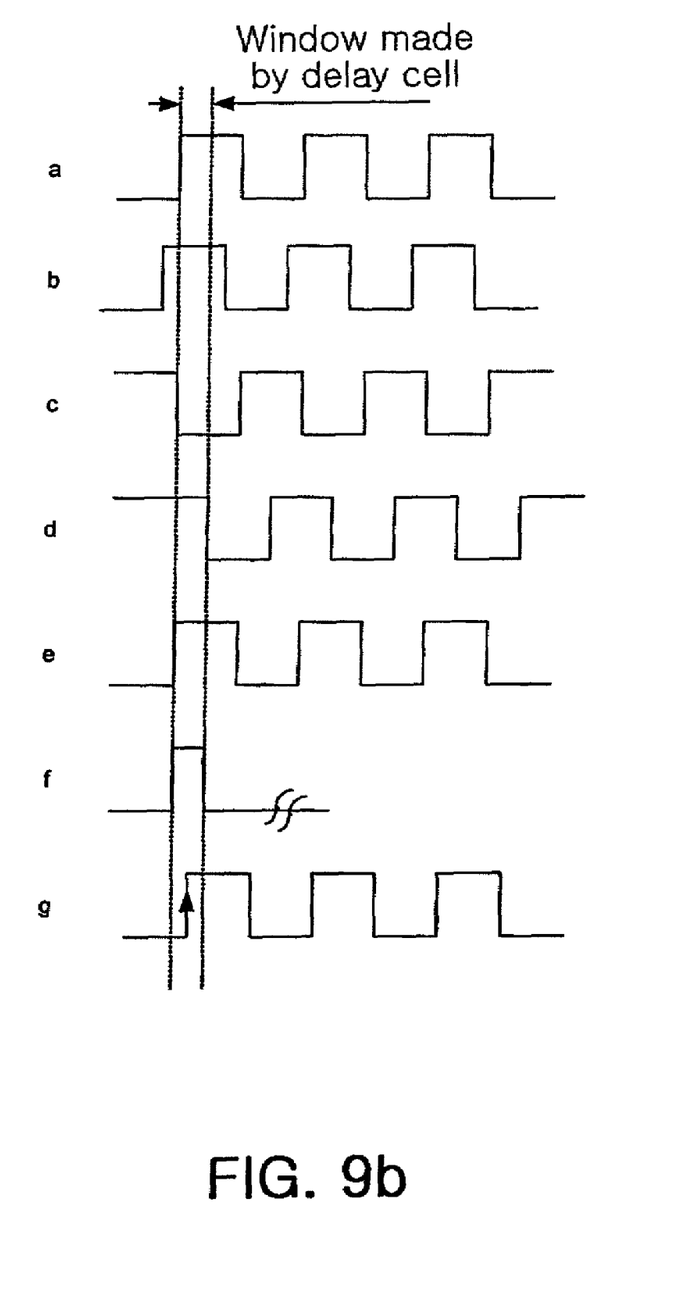
Figure 9C:
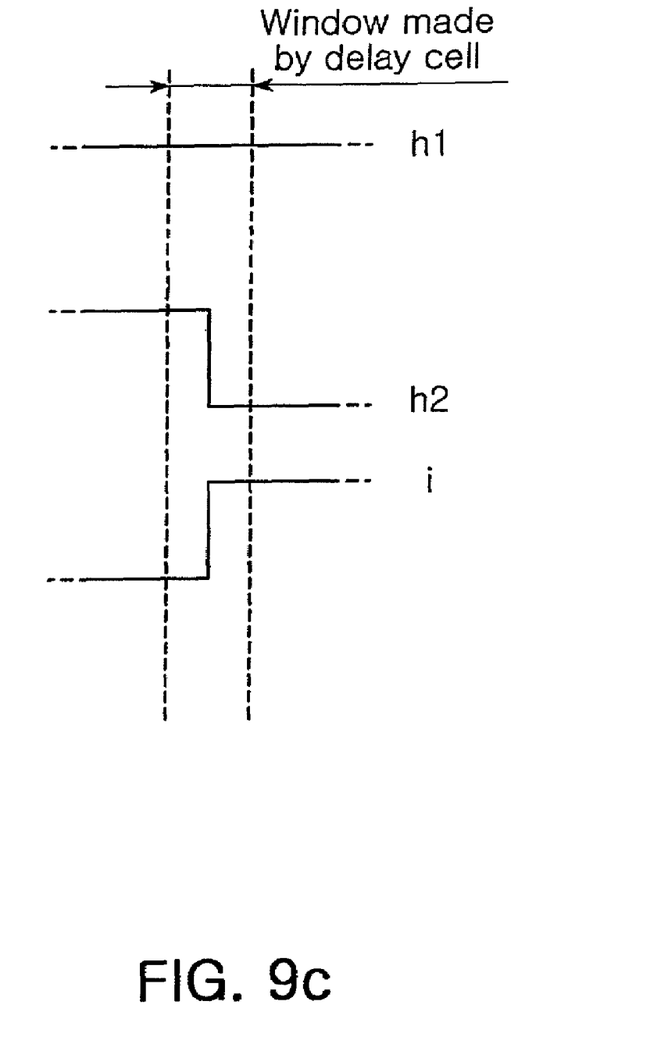

FIGS. 9a~9c are waveform diagrams illustrating waveforms displayed at individual nodes contained in the block diagrams of FIGS. 7~8 according to the present invention. FIG. 9a shows a waveform diagram illustrating an output signal of the first window setup unit 71, which receives the reference frequency (Fref) at the first input terminal (In1), and receives the division frequency (Fdiv) at the second input terminal (In2). FIG. 9b shows a waveform diagram illustrating an output signal of the second window setup unit 72, which receives the division frequency (Fdiv) at the first input terminal (In1), and receives the reference frequency (Fref) at the second input terminal (In2). FIG. 9c shows a waveform diagram illustrating input and output signals of the NAND logic unit 73 shown in FIG. 7. FIGS. 9a~9c are waveform diagrams of an examples in which a phase difference between the reference frequency (Fref) and the division frequency (Fdiv) is contained in the first window equal to the half of the first range.

Referring to FIG. 9a, the reference frequency (Fref) applied to the first input terminal (In1) (i.e., the node 'a') of the first window setup unit 71 is inverted to be the waveform of the node 'c' by the inversion buffer 711. The inverted waveform is outputted in the form of the waveform of the node 'd' by the delay cell 712. The degree of delay created by the delay cell 712 corresponds to the half of the first range. The waveform of the node 'd' and the waveform of the node 'e' are applied to the AND logic unit 713. The output signal of the AND logic unit 713 forms a specific window capable of indicating a logic high signal at a specific period in the same manner as in the node 'f'.

In the meantime, the delay cell 714 delays the division frequency (Fdiv) applied to the node 'b' by the same magnitude as that of the delay cell 712, such that it outputs the waveform of the node 'g'.

As can be seen from FIG. 9c, the waveform of the node 'g' has no rising edge in the window of the node 'f', such that there is no trigger signal. As a result, the D-flipflop 715 outputs a logic high signal.

In the meantime, as shown in FIG. 9b, the reference frequency (Fref) and the division frequency (Fdiv) are applied to the second window setup unit 72. In this case, the reference frequency (Fref) is applied to the second input terminal (In2) of the second window setup unit 72, and the division frequency (Fdiv) is applied to the first input terminal (in1) of the second window setup unit 72. As shown in the waveform of the node 'f', the window is established by the division frequency (Fdiv) in the same manner as in the first window setup unit 71. The waveform (i.e., the waveform of the node 'g') of the delayed reference frequency received in the second input terminal (In2) of the second window setup unit 72 forms the rising edge in the window created by the division frequency (Fdiv). Therefore, a trigger signal occurs, such that the inverted output signal (QB) of the D-flipflop 715 is converted from a logic high signal to a logic low signal as soon as the rising edge occurs.

Therefore, the output signal (h1) of the first window setup unit 71 maintains a logic high level, and the output signal (h2) of the second window setup unit 72 is changed from the logic high level to the logic low level, such that the output signal of the NAND logic unit 73 of the window detector 612 is changed from the logic low level to the logic high level, and finally the logic high signal is applied to the signal selector 611.

According to the present invention, the signal selector 611 may be implemented with a multiplexer (MUX), such that it may output the second phase-difference signal if the window detector outputs the logic high signal, or may output the first phase-difference signal if the window detector outputs the logic low signal. If the output signal of the window detector 612 is the logic high signal, this indicates that the phase difference is contained in the window corresponding to the first range, such that the above-mentioned multiplexer outputs the second phase-difference signal. Otherwise, if the output signal of the window detector 612 is the logic low signal, this indicates that the phase difference is outside of the window corresponding to the first range, such that the above-mentioned multiplexer outputs the first phase-difference signal.

As described above, the phase frequency detector according to the present invention employs two PFDs having nonlinear characteristics in different phase-difference ranges, selects a single PFD capable of forming a phase-difference range within a nonlinear area from among the two PFDs, and outputs the output signal of the selected PFD to an output terminal of the overall PFD. Therefore, the PFD according to the present invention can maintain the linear characteristics within an overall phase comparison range $[-2\pi, 2\pi]$, and can considerably improve in-band phase noise characteristics of the Phase Locked Loop.

As apparent from the above description, a phase frequency detector (PFD) according to the present invention employs two PFDs having nonlinear characteristics in different phase-difference ranges, selects a single PFD capable of forming a phase-difference range within a nonlinear area from among the two PFDS, and outputs the output signal of the selected PFD to an output terminal of the overall PFD, such that it can maintain linear output characteristics in an overall phase comparison range.

In addition, the PFD according to the present invention can greatly improve in-band phase noise characteristics of the PLL.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A phase frequency detector for comparing a reference frequency with a division frequency created by dividing an output frequency of a voltage controlled oscillator (VCO) by a predetermined division ratio, creating a phase-difference signal corresponding to a phase difference between the reference frequency and the division frequency, and improving noise characteristics, the phase frequency detector comprising:

a first phase frequency detector for receiving the reference frequency and the division frequency, creating a first phase-difference signal corresponding to a phase difference between the received reference and division frequencies, and having nonlinearity if the phase difference between the reference and division frequencies is in a first range;

a second phase frequency detector for receiving the reference frequency and the division frequency, creating a second phase-difference signal corresponding to a phase difference between the received reference and division frequencies, and having nonlinearity if the phase difference between the reference and division frequencies is in a second range different from the first range; and a signal selection unit for generating the second phase-difference signal if the phase difference between the reference and division frequencies is in the first range, and generating the first phase-difference signal if the phase difference between the reference and division frequencies is in the second, wherein the signal selection unit includes:
a window detector for determining any one of the first range and the second range to be a window, and determining whether the phase difference between the reference frequency and the division frequency is contained in the window; and
a signal selector for selecting a phase-difference signal having nonlinearity within a range different from that of the window if the phase difference between the reference frequency and the division frequency is contained in the window, selecting a phase-difference signal having nonlinearity within the window if the phase difference between the reference frequency and the division frequency is not contained in the window, and outputting the selected phase-difference signal.

2. The phase frequency detector according to claim 1, wherein:
the first range is a range $[-\pi, \pi]$, and the second range is a range $[-2\pi, -\pi]$ and a range $[\pi, 2\pi]$;
the window detector determines the first range to be the window, and determines whether the phase difference between the reference frequency and the division frequency is contained in the first range; and
the signal selector selects the second phase-difference signal if the phase difference between the reference frequency and the division frequency is contained in the first range, selects the first phase-difference signal if the phase difference between the reference frequency and the division frequency is not contained in the first range, and outputs the selected phase-difference signal.

3. The phase frequency detector according to claim 1, wherein the window detector comprises:
a first window setup unit including:
a first inversion buffer for inverting the reference frequency;
a first delay cell for delaying the inverted reference frequency by a predetermined phase difference corresponding to the half of the first range;
a first AND logic unit for performing an AND logic operation of the inverted delayed reference frequency and the reference frequency, and outputting the AND-logic result;
a second delay cell for delaying the division frequency by a specific phase equal to the phase-difference delay of the first delay cell; and
a seventh D-flipflop for triggering the output signal of the first AND logic unit by replying to the rising edge of the output signal of the second delay cell, and outputting an inversion signal of the output signal of the first AND logic unit;
a second window setup unit including:
a second inversion buffer for inverting the division frequency;
a third delay cell for delaying the inverted division frequency by a specific phase equal to the phase-difference delay of the first delay cell;
a second AND logic unit for performing an AND logic operation of the inverted delayed division frequency and the division frequency, and outputting the AND-logic result;
a fourth delay cell for delaying the reference frequency by a specific phase equal to the phase-difference delay of the first delay cell; and
an eighth D-flipflop for triggering the output signal of the second AND logic unit by replying to the rising edge of the output signal of the fourth delay cell, and outputting an inversion signal of the output signal of the second AND logic unit; and
a NAND logic unit for performing a NAND operation of the output signal of the first window setup unit and the output signal of the second window setup unit,
whereby the signal selector outputs the second phase-difference signal if the window detector outputs a logic high signal, and outputs the first phase-difference signal if the window detector outputs a logic low signal.

4. The phase frequency detector according to claim 1, wherein the first range is a specific range $[-\pi, \pi]$.

5. The phase frequency detector according to claim 4, wherein the second range is a range $[-2\pi, -\pi]$ and another range $[\pi, 2\pi]$.

6. The phase frequency detector according to claim 4, wherein the first phase frequency detector includes:
a first D-flipflop for triggering a power-supply voltage by replying to a rising edge of the reference frequency, and outputting the triggered result;
a second D-flipflop for triggering the power-supply voltage by replying to a rising edge of the division frequency (Fdiv), and outputting the triggered result; and
a first NAND logic unit for performing a NAND logic operation of the output signals of the first D-flipflop and the second D-flipflop, and outputting the NAND-logic result to reset terminals of the first and second D-flipflops.

7. The phase frequency detector according to claim 5, wherein the second phase frequency detector includes:
a third D-flipflop for triggerring an inversion signal of its output signal by replying to a rising edge of the reference frequency, and outputting the triggered result;
an inverter for inverting the division frequency;
a fourth D-flipflop for triggerring an inversion signal of its output signal by replying to a rising edge of the inversion frequency of the division frequency generated from the inverter, and outputting the triggered result;
an XOR logic unit for performing a logic operation on the output signals of the third and fourth D-flip-flops;
a fifth D-flipflop for triggerring an output signal of the XOR logic unit by replying to the rising edge of the reference frequency, outputting an inversion signal of the output signal of the XOR logic unit, and receiving an output signal of a sixth D-flipflop at its reset terminal;
a sixth D-flipflop for triggerring an output signal of the XOR logic unit by replying to the rising edge of the division frequency, outputting the triggered result, and receiving the inversion signal generated from the fifth D-flipflop at its reset terminal;
a second NAND logic unit for performing a NAND logic operation of the output signals of the XOR logic unit and the sixth D-flipflop, and outputting the NAND-logic result;
a third NAND logic unit for performing a NAND logic operation of the output signal of the second NAND logic unit and the inversion signal generated from the fifth D-flip-flop, and outputting the NAND-logic result.

* * * * *